(12) United States Patent
Zhang et al.

(10) Patent No.: US 12,021,577 B1
(45) Date of Patent: Jun. 25, 2024

(54) SERIAL COMMUNICATION LINK DRIVER CIRCUIT WITH SWITCHABLE SHUNT CIRCUIT

(71) Applicant: Apple Inc., Cupertino, CA (US)

(72) Inventors: Yudong Zhang, San Diego, CA (US); Sanjeev K. Maheshwari, Fremont, CA (US); Charles L. Wang, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/063,434

(22) Filed: Dec. 8, 2022

(51) Int. Cl.
*H04B 3/02* (2006.01)
*H03K 17/687* (2006.01)

(52) U.S. Cl.
CPC ........... *H04B 3/02* (2013.01); *H03K 17/6874* (2013.01)

(58) Field of Classification Search
CPC . H04B 1/40; H04B 1/006; H04B 1/48; H04B 1/0458; H04B 2001/0408; H04B 5/72; H04B 5/79; H04B 5/26; H04B 1/3827; H04L 5/1461; H04L 5/001; H04L 12/2838; H04L 25/0298; H04L 25/4904; H04L 25/0272; H04L 25/0278; H04L 25/0292; H03H 7/38; H03H 7/40; H03H 7/0115; H03H 9/542; H03H 7/1758; H03H 7/1766; H03H 9/6483; H03H 9/605

USPC ........................................................ 375/257
See application file for complete search history.

(56) References Cited

U.S. PATENT DOCUMENTS

| | | | |
|---|---|---|---|
| 7,936,830 B2 | 5/2011 | Hershbarger | |
| 8,063,713 B2 | 11/2011 | Cheng et al. | |
| 8,633,733 B2 | 1/2014 | Dettloff et al. | |
| 9,628,082 B1* | 4/2017 | Smith | H03K 19/018585 |
| 10,790,747 B1* | 9/2020 | Vitunic | H02M 3/158 |
| 11,068,435 B2* | 7/2021 | Maung | G06F 13/4068 |
| 2013/0321095 A1* | 12/2013 | Lam | H04B 7/04 333/105 |
| 2016/0020732 A1* | 1/2016 | Wallis | H03F 3/245 330/251 |
| 2020/0007082 A1* | 1/2020 | Robinson | H03B 5/06 |
| 2021/0118476 A1* | 4/2021 | Kojima | G11C 7/222 |
| 2022/0190936 A1* | 6/2022 | Jin | H04B 17/19 |
| 2023/0253183 A1* | 8/2023 | Mavretic | H03F 3/195 333/32 |

\* cited by examiner

*Primary Examiner* — Eva Y Puente
(74) *Attorney, Agent, or Firm* — Kowert, Hood, Munyon, Rankin & Goetzel, P.C.; Dean M. Munyon

(57) ABSTRACT

A driver circuit for a serial communication bus employs multiple switch circuits to generate different voltage levels on a set of signal lines included in the serial communication bus. The different voltage levels correspond to different values for a set of bits to be transmitted via the serial communication bus. The driver circuit also employs a shunt circuit that couples at least two of the signals together in response to the set of bits matching a particular data pattern.

20 Claims, 10 Drawing Sheets

| | MSB of Bits 109 | LSB of Bits 109 | Differential Voltage |
|---|---|---|---|
| Level 3 | 1 | 0 | $V_{DD}/2$ |
| Level 2 | 1 | 1 | $V_{DD}/6$ |
| Level 1 | 0 | 1 | $-V_{DD}/6$ |
| Level 0 | 0 | 0 | $-V_{DD}/2$ |

*FIG. 6*

SERIAL COMMUNICATION LINK DRIVER CIRCUIT WITH SWITCHABLE SHUNT CIRCUIT

BACKGROUND

Technical Field

This disclosure relates to the field of high-speed communication interface design and, in particular, to high-speed transmitter circuits.

Description of the Related Art

Computing systems typically include a number of interconnected integrated circuits. In some cases, the integrated circuits may communicate using communication channels or links to transmit and receive data bits. The communication channels may support parallel communication, in which multiple data bits are transmitted in parallel, or serial communication, in which data bits are transmitted one bit at a time in a serial fashion.

The data transmitted between integrated circuits may be encoded to aid in transmission. For example, in the case of serial communication, data may be encoded to provide sufficient transitions between logic states to allow for clock and data recovery circuits to operate. Alternatively, in the case of parallel communication, the data may be encoded to reduce switching noise or to improve signal integrity.

During transmission of the data, the physical characteristics of the communication channel may attenuate a transmitted signal associated with a particular data bit. For example, the impedance of wiring included in the communication channel or link may attenuate certain frequency ranges of the transmitted signal. Additionally, impedance mismatches between wiring included in the communication channel and devices coupled to the communication channel may induce reflections of the transmitted signal, which may degrade subsequently transmitted signals corresponding to other data bits.

BRIEF DESCRIPTION OF THE DRAWINGS

FIG. 6 is a chart depicting different signal voltage levels for different values of input bits.

Figure 1:
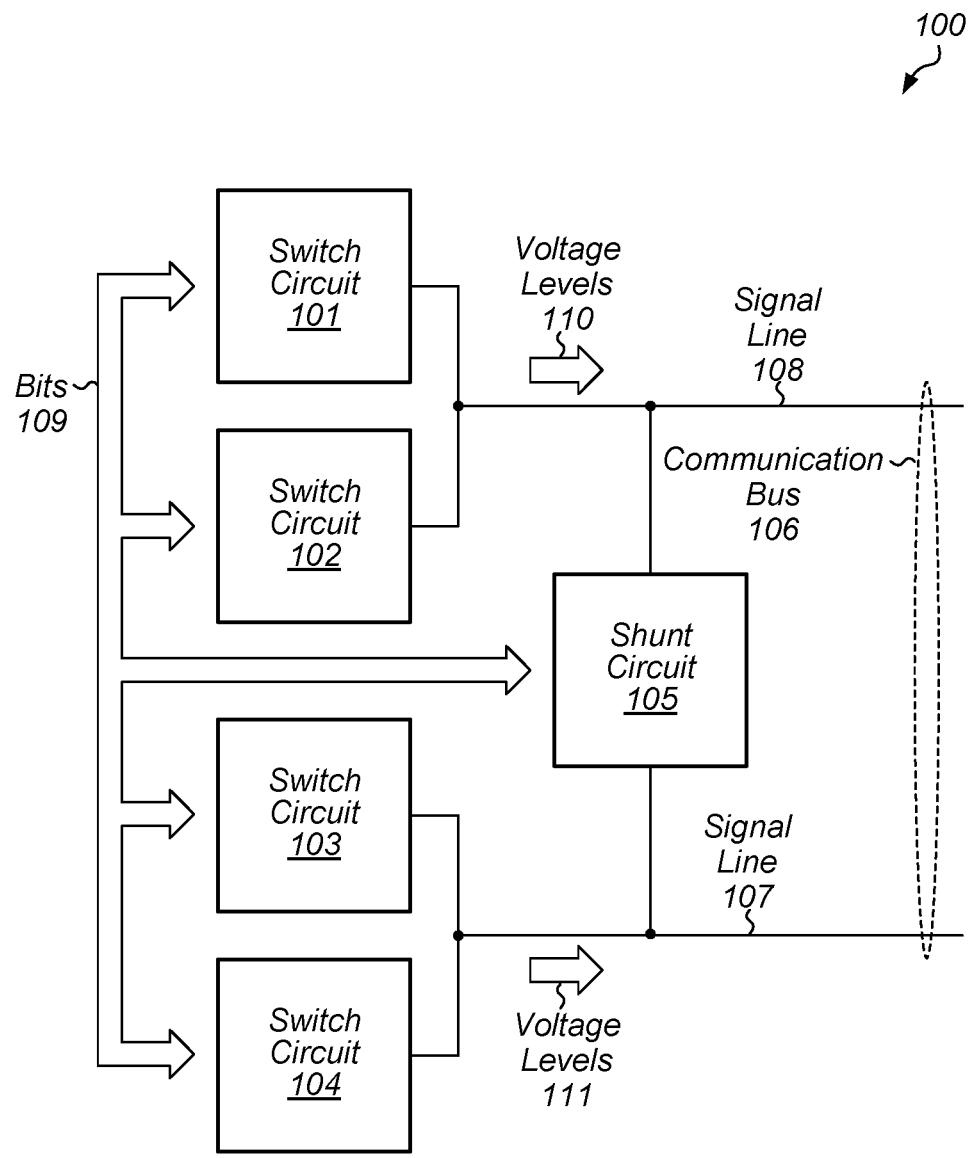
FIG. 1 is a block diagram of an embodiment of a driver circuit for a communication bus in a computer system.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed but, on the contrary, the intention is to cover all modifications, equivalents and alternatives falling within the spirit and scope of the appended claims.

DETAILED DESCRIPTION OF EMBODIMENTS

A computing system may include one or more integrated circuits, such as, e.g., a central processing unit (CPU) and memories. Various integrated circuits of the computing system may communicate through either a serial or parallel interface. In a parallel interface, multiple data bits are communicated simultaneously, while in a serial interface, data is communicated as a series of sequential single data bits. When employing a serial interface to communicate data between two devices included in a computing system, the data may be transmitted according to different protocols. For example, the data may be transmitted using a return to zero (RZ) protocol, non-return to zero (NRZ) protocol, pulse amplitude modulation (PAM), or any suitable combination thereof.

In some of the pulse amplitude modulation protocols, e.g., PAM4, different data symbols are differentially encoded using respective voltage levels of a pair of signal lines included in a communication bus. For example, a difference in the respective voltage levels of the signal lines corresponding to half of the power supply voltage may correspond to one data symbol, while a difference in the respective voltage levels of the signal lines corresponding to one-sixth of the power supply voltage may correspond to another data symbol. In the PAM4 protocol, a given data symbol can encode two bits of data.

To generate the various voltage differences on the signal wires of a serial communication bus, a driver circuit generates various voltage levels on each signal wire based on values of the bits that are to be transmitted. Such driver circuits typically includes multiple switches that selectively couple the signal lines to either a power supply node or a ground supply node via resistors. In conjunction with a load circuit coupled to the serial communication bus, the current moving through the resistors generates the desired voltages on the signal lines of the communication bus.

As the signal lines are coupled, via corresponding resistors, to the power supply node or the ground supply node in response to changes in the bit values to be transmitted, current is drawn from the power supply node to charge the capacitance associated with the signal lines. Depending on the speed with which the voltage levels on the signal lines changes, considerable current can be drawn from the power supply node (e.g., ~10.4 mA for a PAM4 driver). Such current consumption and associated power dissipation can result in larger component sizes for voltage regulator or power converter circuits supplying the driver circuit. In mobile computing applications, the driver circuit power dissipation can result in a reduction in battery life.

The embodiments illustrated in the drawings and described below provide techniques for reducing power consumption of a communication bus driver circuit that employs a shunt circuit that can couple two or more of the signal lines together for certain combinations of bit values that are to be transmitted. By coupling the signal lines together, previous voltage levels of the signal lines are used to generate new voltage levels on the signals lines, which allows for less current to be drawn from the power supply node, thereby reducing power consumption of the driver circuit.

A block diagram of a driver circuit for a serial communication bus is depicted in FIG. 1. As illustrated, driver circuit 100 includes switch circuits 101-104 and shunt circuit 105.

Switch circuits 101 and 102 are configured to generate, based on bits 109, voltage levels 110 on signal line 108 of communication bus 106. In a similar fashion, switch circuits 103 and 104 are configured to generate, based on bits 109, voltage levels 111 on signal line 107 of communication bus 106.

In various embodiments, communication bus 106 may be implemented using a serial communication protocol such as PAM4, PAM6, and the like. Although only two signal lines are depicted as being included in communication bus 106, in other embodiments, any suitable number of signal lines, including ground shield lines, may be employed.

In some embodiments, switch circuits 101-104 can use a subset of bits 109 to generate voltage levels 110 and 111. As described below in more detail, switch circuit 101 may be configured to generate a particular one of voltage levels 110 on signal line 108 based on a value of a complement of a most-significant-bit (MSB) of bits 109. In other embodiments, switch circuits 101-104 may use true or complement values of the MSB of bits 109, a least-significant-bit (LSB) of bits 109, or any suitable combination thereof including any intervening bits of bits 109.

In various embodiments, a voltage difference (also referred to as a "differential voltage") between signal line 107 and signal line 108 encode a data symbol that corresponds to a given set of values of bits 109. It is noted that bits 109 can include any suitable number of bits, and a number of voltages levels includes in voltage levels 110 and voltage levels 111 can be based on the number of bits included in bits 109. For example, in some embodiments, bits 109 includes two bits and each of voltage levels 110 and 111 include 4 voltage levels. In cases where more than two bits are included in bits 109, additional voltage levels can be included in voltage levels 110 and 111.

Shunt circuit 105 is configured to couple signal line 107 to signal line 108 in response to a determination that a subset of bits 109 matches a particular pattern. By coupling signal line 107 to signal line 108, driver circuit 100 can generate one of the voltage levels necessary to encode a data symbol while drawing less power from a power supply node coupled to driver circuit 100, thereby reducing overall power consumption and extending the life of a battery in mobile computer applications.

In various embodiments, the output impedances of switch circuits 101-104 and shunt circuit 105 are selected to match the characteristic impedance of signal lines 107 and 108. As used herein, the characteristic impedance of a signal line refers to a ratio of the amplitudes of voltage and current of a single wave propagating along the signal line. As described below, switch circuits 101-104 and shunt circuit 105 can employ impedance elements whose values are selected so that the characteristic impedance of signal lines 107 and 108 are matched independent of the value of bits 109. By matching the characteristic impedance of signal lines 107 and 108, power transfer to signal lines 107 and 108 may, in various embodiments, be improved and signal distortion limited.

In various embodiments, the particular pattern can include particular values of a subset of bits 109. For example, in some embodiments, shunt circuit 105 may be configured to couple signal line 107 to signal line 108 in response to a determination that a value of a least-significant-bit (LSB) of bits 109 is a logical-1. It is noted that in other embodiments, additional bits may be included in the pattern that activates shunt circuit 105.

As used herein, when a signal is activated, it is set to a logic or voltage level that activates a load circuit or device. The logic level may be either a high logic level or a low logic level depending on the load circuit. For example, an active state of a signal coupled to a p-channel MOSFET is a low logic level (referred to as an "active low signal" or "logical-0"), while an active state of a signal coupled to an n-channel MOSFET is a high logic level (referred to as an "active high signal" or "logical-1").

Figure 2:
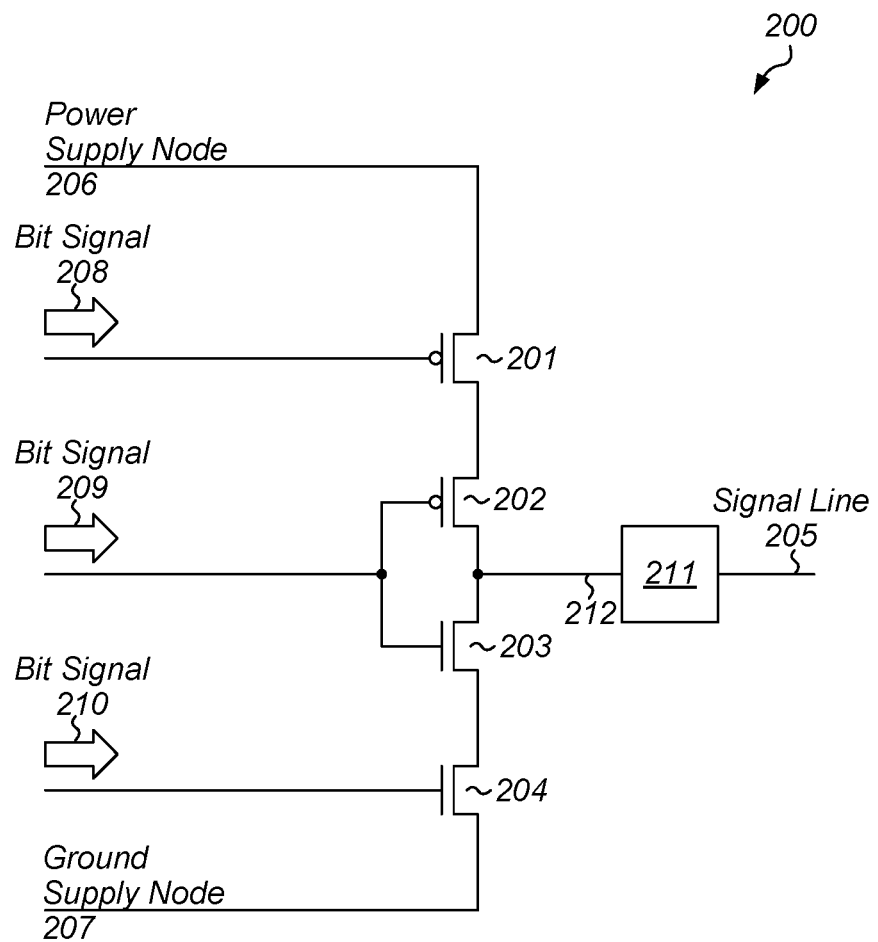
FIG. 2 is a block diagram of an embodiment of a switch circuit for a driver circuit.

Turning to FIG. 2, a block diagram of an embodiment of a switch circuit is depicted. As illustrated, switch circuit 200, which may correspond to either of switch circuits 102 or 103 as depicted in FIG. 1, includes transistors 201-204, and impedance element 211.

Transistor 201 is coupled between power supply node 206 and transistor 202, and is controlled by bit signal 208. Transistor 202 is coupled between device 201 and node 212, and is controlled by bit signal 209.

Transistor 203 is coupled between node 212 and transistor 204, and is controlled by bit signal 209. Transistor 204 is coupled between device 203 and ground supply node 207, and is controlled by bit signal 210.

Impedance element 211 is coupled between node 212 and signal line 205. In various embodiments, signal line 205 may correspond to either of signal line 107 or signal line 108 as depicted in FIG. 1. In various embodiments, impedance element 211 may include any suitable combination of resistors, inductors, and capacitors, whose value are selected to match a characteristic impedance of signal line 205. In some cases, one or more of the circuit elements included in impedance element 211 may be programmable or trimmable post-manufacture to allow for different characteristic impedances of signal line 205 in different applications.

In various embodiments, bit signals 208-210 may correspond to different ones of bits 109 or complement values of bits 109. For example, in some cases, bit signal 208 may correspond to a complement value of a least-significant-bit (LSB) of bits 109, bit signal 209 may correspond to a complement value of a most-significant-bit (MSB) of bits 109, while bit signal 210 may correspond to a true value of the LSB of bits 109. Alternatively, bit signal 208 may correspond to a true value of the LSB of bits 109, bit signal 209 may correspond to a true value of the MSB of bits 109, and bit signal 210 may correspond to the complement value of the LSB of bits 109.

Depending on respective values of bit signals 208-210, different ones of transistors 201-204 may be activated, while other ones of transistors 201-204 may be deactivated. In cases where transistors 201 and 202 are activated and transistors 203 and 204 are deactivated, signal line 205 is coupled to power supply node 206. In cases where transistors 201 and 202 are deactivated and transistors 203 and 204 are activated, signal line 205 is coupled to ground supply node 207. In some cases, the respective values of bit signals 208-210 are such that all of transistors 201-204 are deactivated. In such cases, switch circuit 200 appears as a high impedance on signal line 205. As used herein, when a circuit appears as a high impedance, the input or output of the circuit can have an impedance in which no current, other than transistor leakage current, can flow into or out of the circuit.

In various embodiments, transistors 201 and 202 may be implemented as p-channel metal-oxide semiconductor field-effect transistors (MOSFETs), Fin field-effect transistors (FinFETs), gate-all-around field-effect transistors (GAAFETs), or any other suitable transconductance devices. In some embodiments, transistors 203 and 204 may be implemented as n-channel MOSFETs, FinFETs, GAAFETs, or any other suitable transconductance devices. It is noted that although transistors 201-204 are depicted as single transistors, in other embodiments, any of transistors 201-204 may be implemented using multiple transistors coupled together in parallel.

Figure 3:
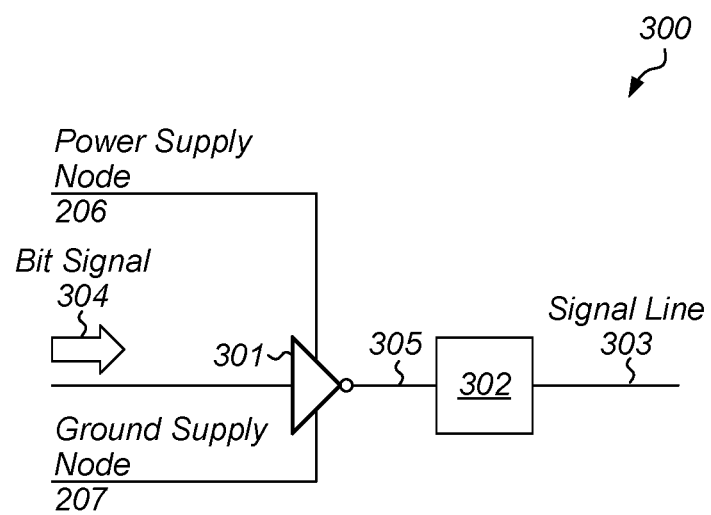
FIG. 3 is a block diagram of another embodiment of a switch circuit for a driver circuit.

Turning to FIG. 3, a block diagram of another embodiment of a switch circuit is depicted. As illustrated, switch circuit 300 includes inverter circuit 301 and impedance element 302. In various embodiments, switch circuit 300 may correspond to either of switch circuits 101 or 104 as depicted in FIG. 1.

Inverter circuit 301 is coupled to power supply node 206, ground supply node 207 and node 305. Impedance element 302 is coupled between node 305 and signal line 303. In various embodiments, signal line 303 may correspond to either of signal lines 107 or 108 as depicted in FIG. 1.

Inverter circuit 301 is configured to couple node 305 to either power supply node 206 or ground supply node 207 based on bit signal 304. For example, in response to a determination that bit signal 304 is at a high logic level (also referred to as a "logical-1" value"), inverter circuit 301 may be configured to couple node 305 to ground supply node 207. Alternatively, in response to a determination that bit signal 304 is at a low logic level (also referred to as a "logical-0" value), inverter circuit 301 may be configured to couple node 305 to power supply node 206. In various embodiments, bit signal 304 may correspond to either a true value of a MSB of bits 109 or a complement value of the MSB of bits 109.

When node 305 is coupled to power supply node 206, a current flows from power supply node 206 into signal line 303, generating a voltage drop across impedance element 302, resulting in a voltage level on signal line 303. The voltage level on signal line 303 may be used in conjunction with a voltage level on another signal line to encode a data symbol value that corresponds to a respective set of values for bits 109.

In cases when node 305 is coupled by inverter circuit 301 to ground supply node 207, a current flows from signal line 303, through impedance element 302, into ground supply node 207. As the current flows through impedance element 302, a voltage drop across impedance element 302 results in a voltage level on signal line 303. As above, the voltage level on signal line 303 may be used in conjunction with a voltage level on another signal line to encode a data symbol value that corresponds to a respective set of values for bits 109.

In various embodiments, inverter circuit 301 may be implemented as a complementary metal-oxide semiconductor (CMOS) inverter, or any other suitable inverting amplifier circuit including those implemented with technologies other than CMOS.

Impedance element 302 may, in various embodiments, include any suitable combination of resistors, inductors, and capacitors, whose value are selected to match a characteristic impedance of signal line 303. In some cases, one or more of the circuit elements included in impedance element 302 may be programmable or trimmable post-manufacture to allow for different characteristic impedances of signal line 303 in different applications.

Figure 4:
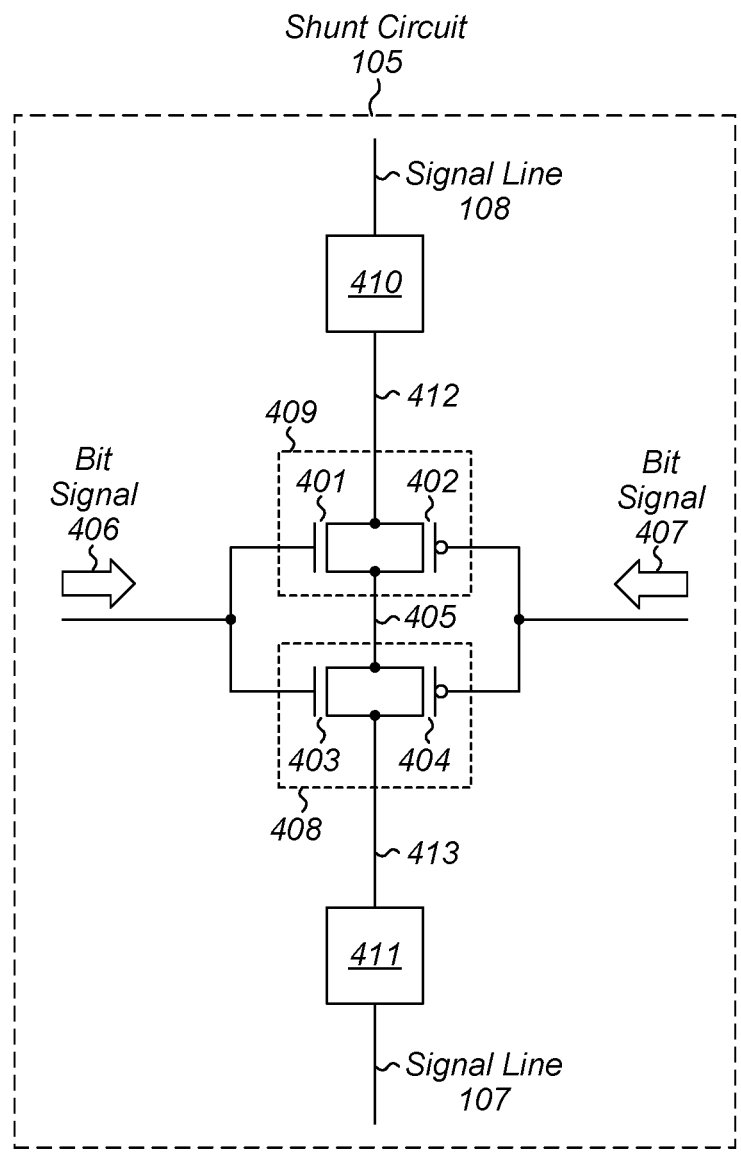
FIG. 4 is a block diagram of an embodiment of a shunt circuit for a driver circuit.

A block diagram of an embodiment of shunt circuit 105 is depicted in FIG. 4. As illustrated, shunt circuit 105 includes pass gate circuit 408 (also referred to as a "transmission gate circuit"), which includes transistors 403 and 404, pass gate circuit 409, which includes transistors 401 and 402, and impedance elements 410 and 411.

Pass gate circuit 409 is coupled between node 412 and node 405. In a similar fashion, pass gate circuit 408 is coupled between node 405 and node 413. In response to an activation of bit signals 406 and 407, pass gate circuits 408 and 409 may activate, coupling signal line 108 to signal line 107 via impedance elements 410 and 411. In various embodiments, bit signals 406 and 407 may correspond to a true and a complement value of an LSB of bits 109. It is noted that although two pass gate circuits are depicted in the embodiment of FIG. 4, in other embodiments, any suitable number of pass gate circuits may be employed.

When both pass gate circuit 408 and pass gate circuit 409 are activated and signal line 108 is coupled to signal line 107, a current can flow from one signal line, through pass gate circuits 408 and 409, to the other signal line dependent upon respective voltage levels of signal lines 107 and 108. For example, if a voltage level of signal line 108 is higher than a voltage level of signal line 107, current will flow from signal line 108 to signal line 107.

As current flows through each of pass gate circuits 408 and 409, respective voltage drops across pass gate circuits 408 and 409, and impedance elements 410 and 411 generate respective voltage levels on signal lines 107 and 108. The respective voltage drops across pass gate circuits 408 and 409 may be determined by electrical characteristics (e.g., on resistance) of transistors 403 and 404, and transistors 401 and 402, respectively. The electrical characteristics of transistors 401-404 may be adjusted by changing physical characteristics of the transistors such as transistor width, channel length, etc., or any suitable combination thereof. The physical characteristics may, in various embodiments, be selected based on desired voltage levels for signal lines 107 and 108 in order to conform to a particular communication protocol such as PAM4.

As illustrated, pass gate circuits 408 and 409 can be implemented as CMOS pass gates. In other embodiments, pass gate circuits 408 and 409 may be implemented using any suitable switching circuit including those implemented with technologies other than CMOS. Transistors 401 and 403 may, in various embodiments, be implemented as n-channel MOSFETs, FinFETs, GAAFETs, or any other suitable transconductance devices. Transistors 402 and 404 may, in various embodiments, be implemented as p-channel MOSFETs, FinFETs, GAAFETs, or any other suitable transconductance devices. It is noted that although transistors 401-404 are depicted as single transistors, in other embodiments, transistors 401-404 may be implemented using multiple transistors coupled together in parallel.

Impedance elements 410 and 411 may, in various embodiments, include any suitable combination of resistors, inductors, and capacitors, whose value are selected to match a characteristic impedance of signal lines 107 and 108. In some cases, one or more of the circuit elements included in impedance elements 410 and 411 may be programmable or trimmable post-manufacture to allow for matching different characteristic impedances of signal lines 107 and 108 in different applications. It is noted that although two impedance elements is depicted in the embodiment of FIG. 4, in other embodiments, a single impedance element may be employed.

Figure 5:
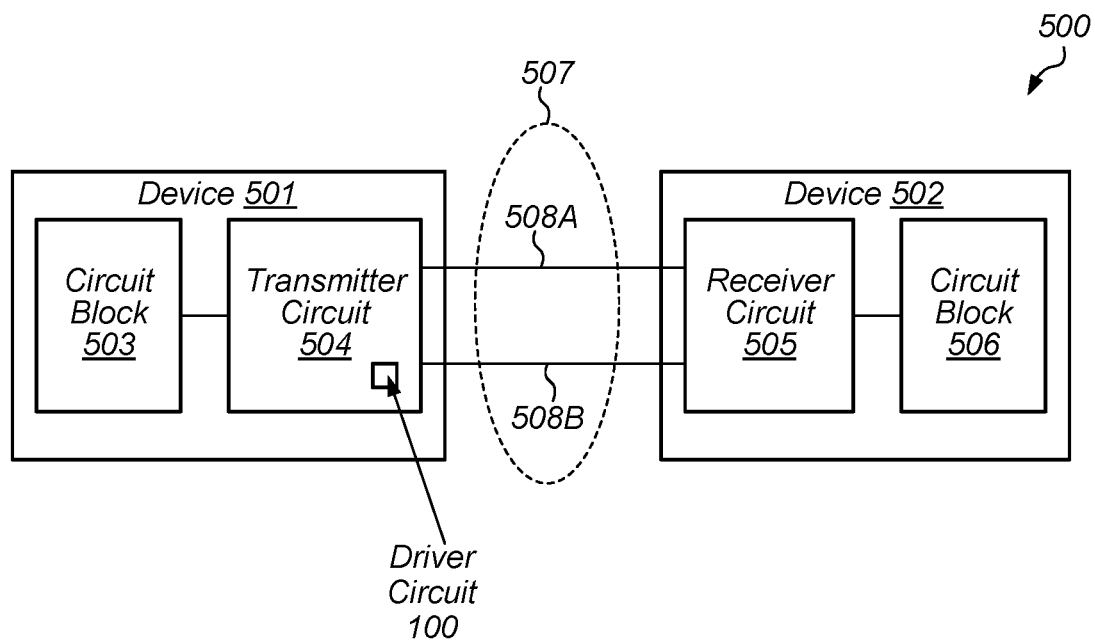
FIG. 5 is a block diagram of an embodiment of a computer system with a communication bus.

As described above, a driver circuit, such as driver circuit 100, may be employed in a computer system. A block diagram of an embodiment of such a computer system is depicted in FIG. 5. As illustrated, computer system 500 includes devices 501 and 502, coupled by communication bus 507.

Device 501 includes circuit block 503 and transmitter circuit 504. In various embodiments, device 501 may be a processor circuit, a processor core, a memory circuit, or any other suitable circuit block that may be included on an integrated circuit in a computer system. It is noted that although device 501 only depicts a single circuit block and a single transmitter circuit, in other embodiments, additional circuit blocks and additional transmitter circuits may be employed.

Transmitter circuit 504, which includes driver circuit 100, is configured to serially transmit signals, via communication bus 507, corresponding to data received from circuit block 503. Such signals may differentially encode one or more bits such that a difference between the respective voltage levels of transmission conduits 508A and 508B, at a particular point in time, correspond to a particular bit value. In various embodiments, such voltage levels may be generated by driver circuit 100 as described above. In some cases, the generation of the signals may include encoding the bits prior to transmission. It is noted that although communication bus 507 is depicted as including two transmission conduits, in other embodiments, any suitable number of transmission conduits may be employed. In various embodiments, transmission conduits 508A and 508B may be implemented as optical cables, wires, metallic traces on a circuit board or other substrate, or any other suitable material that can conduct signals between device 501 and device 502.

Device 502 includes receiver circuit 505 and circuit block 506. Like device 501, device 502 may be a processor circuit, a processor core, a memory circuit, or any other suitable circuit block configured to receive data from transmitter circuit 504. In various embodiments, circuit block 506 may include any suitable combination of processor circuits, memory circuits, and the like.

Devices 501 and 502 may, in some embodiments, be fabricated on a common integrated circuit. In other embodiments, devices 501 and 502 may be located on different integrated circuits mounted on a common substrate or circuit board. In such cases, communication bus 507 may include metal or other conductive traces on the substrate or circuit board, fiber optic cables, and the like. Although only two devices are depicted in computer system 500, in other embodiments, any suitable number of devices may be employed.

Turning to FIG. 6, a chart depicting different signal voltage levels for different values of input bits is depicted. As illustrated, the values depicted in the chart of FIG. 6 may correspond to a PAM4 communication protocol or any other suitable communication protocol that employs four differential voltage levels across the signal lines of a communication bus.

Each of the four differential voltage levels, i.e., level 0 through level 3, correspond to a particular combination of LSB and MSB of a set of bits, such as bits 109 as depicted in FIG. 1. Level 0 corresponds to a case when the values of the LSB and the MSB are both logical-0. This results in switch circuits 101-104 and shunt circuit 105 generating a voltage level across signal line 108 and signal line 107 of $-V_{DD}/2$, where VDD is the voltage level of power supply node 206. It is noted that these voltage levels described in FIG. 6 are merely examples and, in other embodiments, different voltage levels may be employed. For example, if equalization is applied, one or more of the voltage levels depicted in FIG. 6 may be different.

Level 1 corresponds to a case when the value of the MSB is a logical-0 and the value of the LSB is logical-1. This results in switch circuits 101-104 and shunt circuit 105 generating a voltage level across signal line 108 and signal line 107 of $-V_{DD}/6$.

Level 2 corresponds to a case when the value of the MSB is a logical-1 and the value of the LSB is logical-1. This results in switch circuits 101-104 and shunt circuit 105 generating a voltage level across signal line 108 and signal line 107 of $V_{DD}/6$.

Level 3 corresponds to a case when the value of the value of the MSB is a logical-1 and the value of the LSB is a logical-0. This results in switch circuits 101-104 and shunt circuit 105 generating a voltage level across signal line 108 and signal line 107 of $V_{DD}/2$.

It is noted that the voltage levels and bit combinations depicted in the chart of FIG. 6 are an example. In other embodiments, different voltage levels and different corresponding values of the MSB and LSB are possible and contemplated. Moreover, if equalization is applied, where the voltage levels of the transmission conduits are set to a same value for a given data state, other data states may correspond to different voltage levels than those illustrated in FIG. 6. It is further noted that additional voltage levels corresponding to different data state of bits may be employed for other communication protocols such as PAM6, PAM8, and the like.

Various embodiments for driving a serial communication bus have been disclosed. Broadly speaking, a first plurality of driver circuits are configured to generate, on a first signal line included in a communication bus and based on a plurality of bits, a first subset of a plurality of voltage levels. Additionally, a second plurality of driver circuits is configured to generate on a second signal line included in the communication bus and based on the plurality of bits, a second subset of the plurality of voltage levels, wherein a data symbol based on respective values of the plurality of bits is encoded using respective voltage levels of the first signal line and the second signal line. A shunt circuit is configured to couple the first signal line to the second signal line in response to a determination that a subset of the plurality of bits matches a particular pattern.

Figure 7:
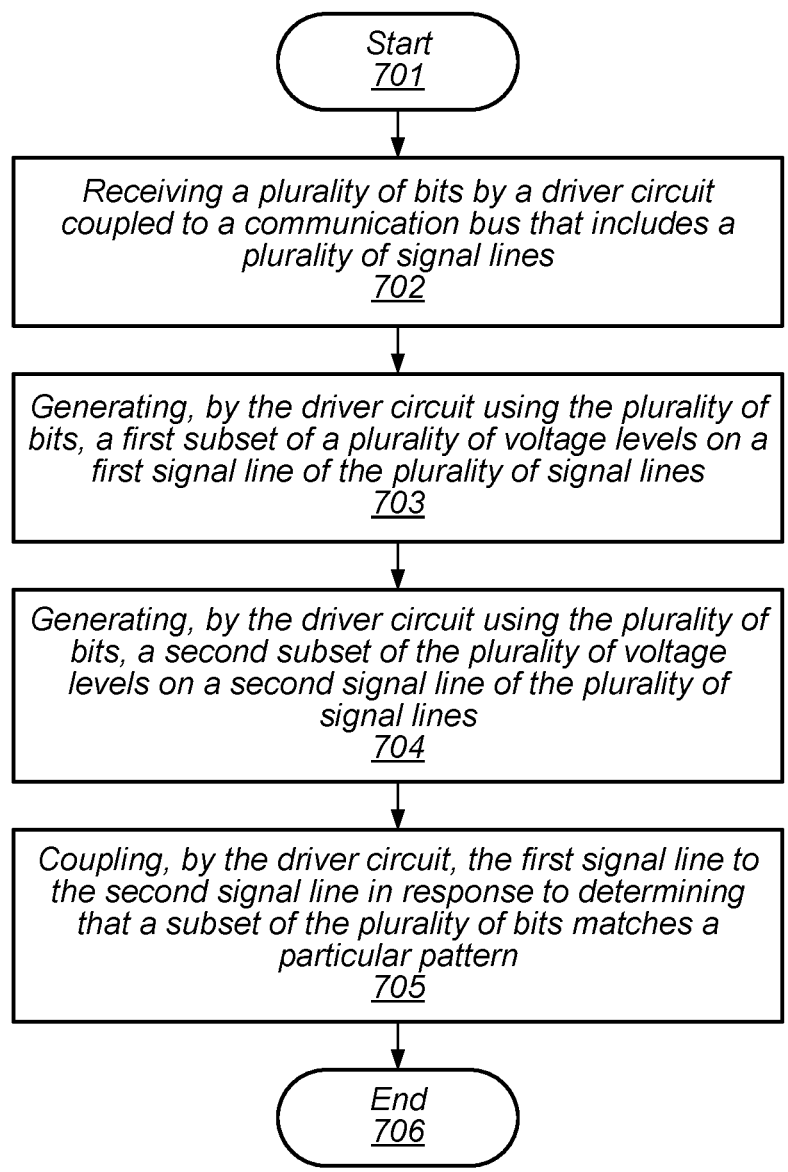
FIG. 7 is a flow diagram of an embodiment of a method for operating a driver circuit.

Turning to FIG. 7, a flow diagram depicting an embodiment of a method for operating a driver circuit is illustrated. The method, which may be applied to various driver circuits including driver circuit 100, begins in block 701.

The method includes receiving a plurality of bits by a driver circuit coupled to a communication bus that includes a plurality of signal lines (block 702).

The method further includes generating, by the driver circuit using the plurality of bits, a first subset of a plurality of voltage levels on a first signal line of the plurality of signal lines (block 703). In some embodiments, generating the first subset of the plurality of voltage levels on the first signal line includes coupling the first signal line to a power supply node via a first resistor in response to determining a most-significant-bit of the plurality of bits is a logical-1. In other embodiments, generating the first subset of the plurality of voltage levels on the first signal line includes coupling, by a plurality of devices, the first signal line to a ground signal line in response to determining a first value of a most-significant-bit of the plurality of bits is a logical-1 and a second value of a least-significant-bit of the plurality of bits is a logical-1.

The method also includes generating, by the driver circuit using the plurality of bits, a second subset of the plurality of voltage levels on a second signal line of the plurality of signal lines (block 704). In some embodiments, generating the second subset of the plurality of voltage levels on the second signal line includes coupling the second signal line to a ground supply node via a second resistor in response to determining a most-significant-bit of the plurality of bits is a logical-1.

The method further includes coupling, by the driver circuit, the first signal line to the second signal line in response to determining that a subset of the plurality of bits matches a particular pattern (block 705). In various embodiments, coupling the first signal line to the second signal line includes activating at least one pass gate circuit included in the driver circuit, wherein the at least one pass gate circuit is coupled between the first signal line and the second signal line.

In some embodiments, the at least one pass gate circuit includes one or more devices, and a physical characteristic of the one or more devices is based on the plurality of voltage levels. In various embodiments, a value of a least-significant-bit of the plurality of bits corresponding to the particular pattern is a logical-1. The method concludes in block 706.

Figure 8:
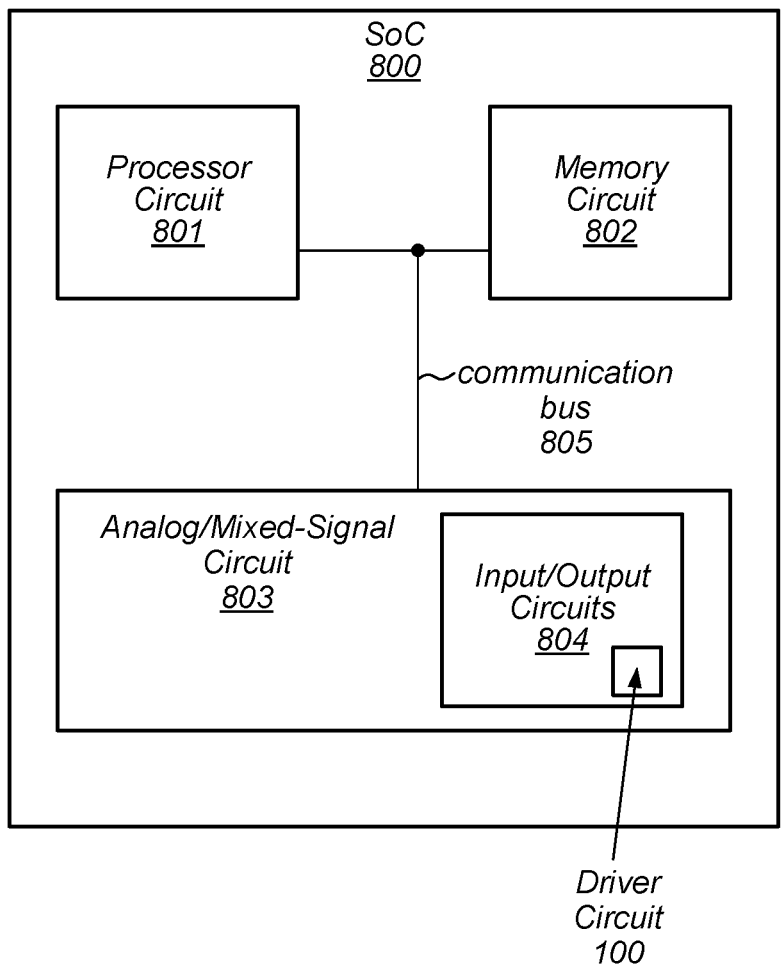
FIG. 8 is a block diagram of one embodiment of a system-on-a-chip that includes a driver circuit.

A block diagram of a system-on-a-chip (SoC) is illustrated in FIG. 8. In the illustrated embodiment, SoC 800 includes processor circuit 801, memory circuit 802, and analog/mixed-signal circuits 803, which includes input/output circuits 804. each of which is coupled to communication bus 805. Processor circuit 801, memory circuit 802, and analog/mixed-signal circuits 803 are coupled to communication bus 805. In various embodiments, SoC 800 may be configured for use in a desktop computer, server, or in a mobile computing application such as, e.g., a tablet, laptop computer, or wearable computing device.

Processor circuit 801 may, in various embodiments, be representative of a general-purpose processor that performs computational operations. For example, processor circuit 801 may be a central processing unit (CPU) such as a microprocessor, a microcontroller, an application-specific integrated circuit (ASIC), or a field-programmable gate array (FPGA). In various embodiments, processor circuit 801 may include an instance of driver circuit 100 that is used to generate various voltage levels on communication bus 805 to transmit data, commands, and the like, on communication bus 805.

Memory circuit 802 may, in various embodiments, include any suitable type of memory such as a Dynamic Random-Access Memory (DRAM), a Static Random-Access Memory (SRAM), a Read-Only Memory (ROM), an Electrically Erasable Programmable Read-only Memory (EEPROM), or a non-volatile memory, for example. It is noted that although a single memory circuit is illustrated in FIG. 8, in other embodiments, any suitable number of memory circuits may be employed. In various embodiments, memory circuit 802 may include an instance of driver circuit 100 that is used to generate various voltage levels on communication bus 805 to transmit data, commands, and the like, on communication bus 805.

As illustrated, analog/mixed-signal circuits 803 includes input/output circuit 804. In various embodiments, analog/mixed-signal circuits 803 may also include a crystal oscillator circuit, a phase-locked loop (PLL) circuit, an analog-to-digital converter (ADC) circuit, and a digital-to-analog converter (DAC) circuit (all not shown). In other embodiments, analog/mixed-signal circuits 803 may be configured to perform power management tasks with the inclusion of on-chip power supplies and voltage regulators. In various embodiments, analog/mixed-signal circuits 803 may include an instance of driver circuit 100 that is used to generate various voltage levels on communication bus 805 to transmit data, commands, and the like, on communication bus 805.

Input/output circuits 804 may be configured to coordinate data transfer between SoC 800 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 804 may be configured to implement a version of Universal Serial Bus (USB) protocol or IEEE 1394 (Firewire®) protocol.

Input/output circuits 804 can include driver circuit 100 and may also be configured to coordinate data transfer between SoC 800 and one or more devices (e.g., other computing systems or integrated circuits) coupled to SoC 800 via a network. In one embodiment, input/output circuits 804 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 804 may be configured to implement multiple discrete network interface ports.

Figure 9:
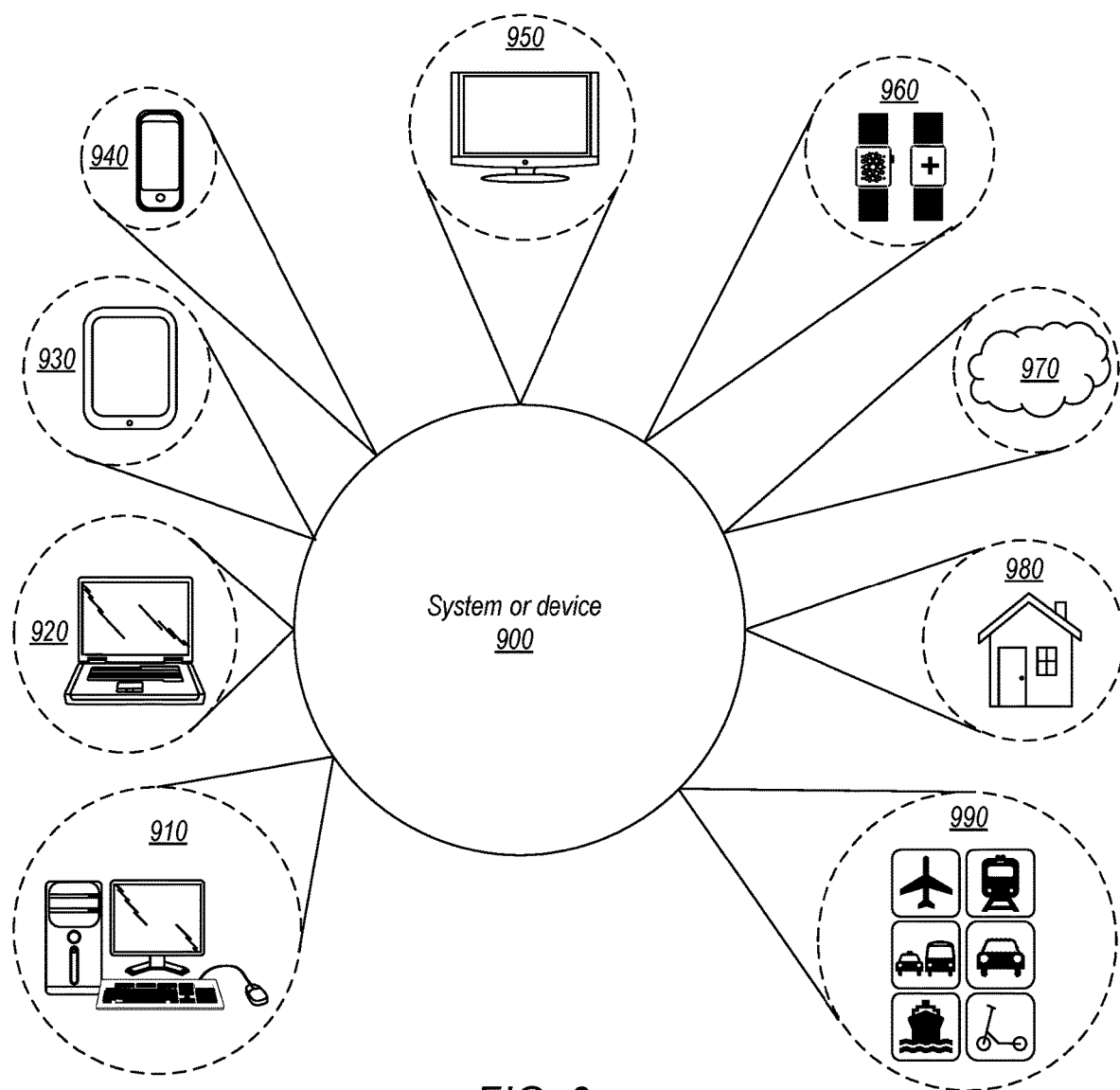
FIG. 9 is a block diagram of various embodiments of computer systems that may include driver circuits.

Turning now to FIG. 9, various types of systems that may include any of the circuits, devices, or systems discussed above are illustrated. System or device 900, which may incorporate or otherwise utilize one or more of the techniques described herein, may be utilized in a wide range of areas. For example, system or device 900 may be utilized as part of the hardware of systems such as a desktop computer 910, laptop computer 920, tablet computer 930, cellular or mobile phone 940, or television 950 (or set-top box coupled to a television).

Similarly, disclosed elements may be utilized in a wearable device 960, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 900 may also be used in various other contexts. For example, system or device 900 may be utilized in the context of a server computer system, such as a dedicated server or on shared hardware that implements a cloud-based service 970. Still further, system or device 900 may be implemented in a wide range of specialized everyday devices, including devices 980 commonly found in the home such as refrigerators, thermostats, security cameras, etc. The interconnection of such devices is often referred to as the "Internet of Things" (IoT). Elements may also be implemented in various modes of transportation. For example, system or device 900 could be employed in the control systems, guidance systems, entertainment systems, etc. of various types of vehicles 990.

The applications illustrated in FIG. 9 are merely exemplary and are not intended to limit the potential future applications of disclosed systems or devices. Other example applications include, without limitation: portable gaming devices, music players, data storage devices, unmanned aerial vehicles, etc.

Figure 10:
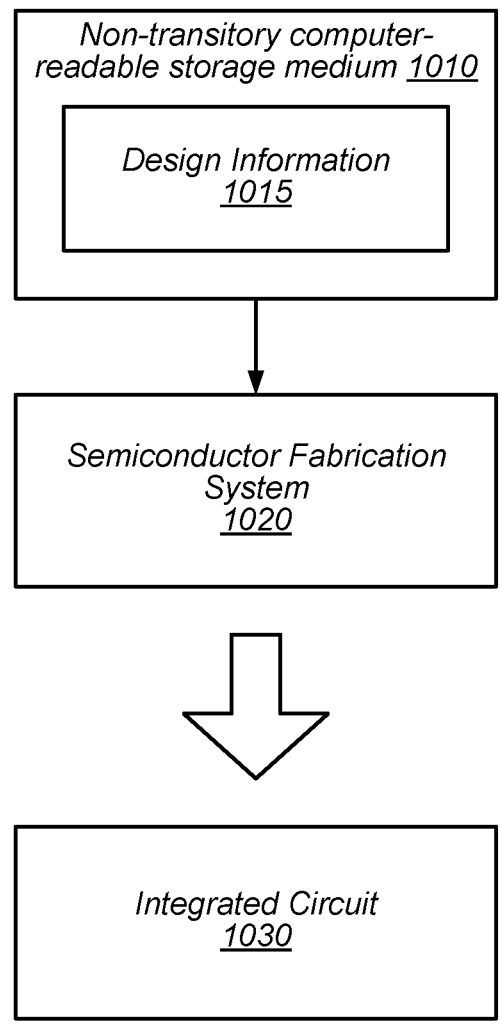
FIG. 10 illustrates an example of a non-transitory computer-readable storage medium that stores circuit design information.

FIG. 10 is a block diagram illustrating an example of a non-transitory computer-readable storage medium that stores circuit design information, according to some embodiments. In the illustrated embodiment, semiconductor fabrication system 1020 is configured to process design information 1015 stored on non-transitory computer-readable storage medium 1010 and fabricate integrated circuit 1030 based on design information 1015.

Non-transitory computer-readable storage medium 1010 may comprise any of various appropriate types of memory devices or storage devices. Non-transitory computer-readable storage medium 1010 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as Flash, magnetic media, e.g., a hard drive, or optical storage; registers, or other similar types of memory elements, etc. Non-transitory computer-readable storage medium 1010 may include other types of non-transitory memory as well or combinations thereof. Non-transitory computer-readable storage medium 1010 may include two or more memory mediums, which may reside in different locations, e.g., in different computer systems that are connected over a network.

Design information 1015 may be specified using any of various appropriate computer languages, including hardware description languages such as, without limitation: VHDL, Verilog, SystemC, SystemVerilog, RHDL, M, MyHDL, etc. Design information 1015 may be usable by semiconductor fabrication system 1020 to fabricate at least a portion of integrated circuit 1030. The format of design information 1015 may be recognized by at least one semiconductor fabrication system, such as semiconductor fabrication system 1020, for example. In some embodiments, design information 1015 may include a netlist that specifies elements of a cell library, as well as their connectivity. One or more cell libraries used during logic synthesis of circuits included in integrated circuit 1030 may also be included in design information 1015. Such cell libraries may include information indicative of device or transistor-level netlists, mask design data, characterization data, and the like, of cells included in the cell library.

Integrated circuit 1030 may, in various embodiments, include one or more custom macrocells, such as memories, analog or mixed-signal circuits, and the like. In such cases, design information 1015 may include information related to included macrocells. Such information may include, without limitation, schematics capture database, mask design data, behavioral models, and device or transistor-level netlists. As used herein, mask design data may be formatted according to graphic data system (GDSII), or any other suitable format.

Semiconductor fabrication system 1020 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1020 may also be configured to perform various testing of fabricated circuits for correct operation.

In various embodiments, integrated circuit 1030 is configured to operate according to a circuit design specified by design information 1015, which may include performing any of the functionality described herein. For example, integrated circuit 1030 may include any of various elements shown or described herein. Further, integrated circuit 1030 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third," when applied to a particular feature, do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation— [entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
   a first plurality of driver circuits configured to generate, on a first signal line included in a communication bus and based on a plurality of bits, a first subset of a plurality of voltage levels;
   a second plurality of driver circuits configured to generate on a second signal line included in the communication bus and based on the plurality of bits, a second subset of the plurality of voltage levels, wherein a data symbol based on respective values of the plurality of bits is encoded using respective voltage levels of the first signal line and the second signal line; and
   a shunt circuit configured to couple the first signal line to the second signal line in response to a determination that a subset of the plurality of bits matches a particular pattern.

2. The apparatus of claim 1, wherein the shunt circuit includes at least one pass gate circuit and at least one impedance element, wherein the at least one pass gate circuit and the at least one impedance element are coupled, in series, between the first signal line and the second signal line, wherein a combined impedance of the at least one pass gate circuit and the at least one impedance element is matched to a characteristic impedance of the first signal line and the second signal line, and wherein to couple the first signal line to the second signal line, the shunt circuit is further configured to activate the at least one pass gate circuit.

3. The apparatus of claim 2, wherein the at least one pass gate circuit includes one or more transistors, and wherein a physical characteristic of the one or more transistors is based on the plurality of voltage levels.

4. The apparatus of claim 1, wherein to generate the first subset of the plurality of voltage levels on the first signal line, the first plurality of driver circuits is further configured to couple the first signal line to a power supply node via a first resistor in response to a determination that a most-significant-bit of the plurality of bits is a logical-1.

5. The apparatus of claim 1, wherein to generate the second subset of the plurality of voltage levels on the second signal line, the second plurality of driver circuits is further configured to couple the second signal line to a ground supply node via a second resistor in response to a determination that a most-significant-bit of the plurality of bits is a logical-1.

6. The apparatus of claim 1, wherein to generate the first subset of the plurality of voltage levels on the first signal line, the first plurality of driver circuits is further configured to couple the first signal line to a ground signal line in response to a determination that a first value of a most-significant-bit of the plurality of bits is a logical-1 and a second value of a least-significant-bit of the plurality of bits is a logical-1.

7. A method, comprising:
receiving a plurality of bits by a driver circuit coupled to a communication bus that includes a plurality of signal lines;
generating, by the driver circuit using the plurality of bits, a first subset of a plurality of voltage levels on a first signal line of the plurality of signal lines;
generating, by the driver circuit using the plurality of bits, a second subset of the plurality of voltage levels on a second signal line of the plurality of signal lines; and
coupling, by the driver circuit, the first signal line to the second signal line in response to determining that a subset of the plurality of bits matches a particular pattern.

8. The method of claim 7, wherein coupling the first signal line to the second signal line includes activating at least one pass gate circuit included in the driver circuit, wherein the at least one pass gate circuit is coupled, in series with at least one impedance element, between the first signal line and the second signal line, wherein a combined impedance of the at least one pass gate and the at least one impedance element matches a characteristic impedance of the first signal line and the second signal line.

9. The method of claim 8, wherein the at least one pass gate circuit includes one or more devices, and wherein a physical characteristic of the one or more devices is based on the plurality of voltage levels.

10. The method of claim 7, wherein a value of a least-significant-bit of the plurality of bits corresponding to the particular pattern is a logical-1.

11. The method of claim 7, wherein generating the first subset of the plurality of voltage levels on the first signal line includes coupling the first signal line to a power supply node via a first resistor in response to determining a most-significant-bit of the plurality of bits is a logical-1.

12. The method of claim 7, wherein generating the second subset of the plurality of voltage levels on the second signal line includes coupling the second signal line to a ground supply node via a second resistor in response to determining a most-significant-bit of the plurality of bits is a logical-1.

13. The method of claim 7, wherein generating the first subset of the plurality of voltage levels on the first signal line includes coupling, by a plurality of devices, the first signal line to a ground signal line in response to determining a first value of a most-significant-bit of the plurality of bits is a logical-1 and a second value of a least-significant-bit of the plurality of bits is a logical-1.

14. An apparatus, comprising:
a first device coupled to a communication bus that includes a plurality of signal lines; and
a second device coupled to the communication bus; and
wherein the first device is configured to:
generate, using a plurality of bits, a first subset of a plurality of voltage levels on a first signal line of the plurality of signal lines;
generate, using the plurality of bits, a second subset of the plurality of voltage levels on a second signal line of the plurality of signal lines; and
couple the first signal line to the second signal line in response to determining that a subset of the plurality of bits matches a particular pattern.

15. The apparatus of claim 14, wherein to couple the first signal line to the second signal line, the first device is further configured to activate at least one pass gate circuit included in the first device, wherein the at least one pass gate circuit is coupled between the first signal line and the second signal line.

16. The apparatus of claim 15, wherein the at least one pass gate circuit includes one or more transistors, and wherein a physical characteristic of the one or more transistors is based on the plurality of voltage levels.

17. The apparatus of claim 14, wherein a value of a least-significant-bit of the plurality of bits corresponding to the particular pattern is a logical-1.

18. The apparatus of claim 14, wherein to generate the first subset of the plurality of voltage levels on the first signal line, the first device is further configured to couple the first signal line to a power supply node via a first resistor in response to determining a most-significant-bit of the plurality of bits is a logical-1.

19. The apparatus of claim 14, wherein to generate the second subset of the plurality of voltage levels on the second signal line, the first device is further configured to couple the second signal line to a ground supply node via a second resistor in response to determining a most-significant-bit of the plurality of bits is a logical-1.

20. The apparatus of claim 14, wherein to generate the first subset of the plurality of voltage levels on the first signal line, the first device is further configured to couple, using a plurality of transistors, the first signal line to a ground signal line in response to determining a first value of a most-significant-bit of the plurality of bits is a logical-1 and a second value of a least-significant-bit of the plurality of bits is a logical-1.

* * * * *